US009734265B2

(12) United States Patent
Arora et al.

(10) Patent No.: US 9,734,265 B2
(45) Date of Patent: Aug. 15, 2017

(54) METHOD AND APPARATUS HAVING ENHANCED OSCILLATOR PHASE NOISE USING HIGH VT MOS DEVICES

(71) Applicant: Texas Instruments Incorporated, Dallas, TX (US)

(72) Inventors: Himanshu Arora, Plano, TX (US); Siraj Akhtar, Richardson, TX (US); Nikolaus Klemmer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/712,336

(22) Filed: May 14, 2015

(65) Prior Publication Data

US 2015/0333698 A1    Nov. 19, 2015

Related U.S. Application Data

(60) Provisional application No. 61/993,490, filed on May 15, 2014.

(51) Int. Cl.
*H03B 5/12* (2006.01)
*H03K 3/013* (2006.01)
*G06F 17/50* (2006.01)

(52) U.S. Cl.
CPC ............ *G06F 17/50* (2013.01); *G06F 17/505* (2013.01); *H03B 5/124* (2013.01); *H03B 5/1212* (2013.01);
(Continued)

(58) Field of Classification Search
CPC ...... H03B 1/04; H03B 5/1212; H03B 5/1215; H03B 5/1228; H03B 5/1231;
(Continued)

(56) References Cited

U.S. PATENT DOCUMENTS 3,958,187 A * 5/1976 Suzuki .................. G04F 5/06
327/115
4,295,062 A * 10/1981 Mihalich .............. H03K 3/3565
327/131
(Continued)

OTHER PUBLICATIONS

Arora, et al., High Performance LC-VCOs for 3GPP Base Station Transceivers, 2014 IEEE 12th International New Circuits and Systems Conference (NEWCAS), Jun. 22, 2014, pp. 417-419, IEEE, Trois-Rivieres, QC.
(Continued)

*Primary Examiner* — Levi Gannon
(74) *Attorney, Agent, or Firm* — Gregory J. Albin; Charles A. Brill; Frank D. Cimino

(57) ABSTRACT

A voltage-controlled oscillator (VCO), includes a resonator circuit connected to receive an input voltage and having a first output node and a second output node; and at least one cross-coupled switching circuit portion, each cross-coupled switching circuit portion comprising a first transistor having a drain connected to the first output node and a second transistor having a drain connected to the second output node, the first transistor having a gate connected between the drain of the second transistor and the second output node and the second transistor having a gate connected between the drain of the first transistor and the first output node, each of the first and second transistors having a threshold voltage that is determined to be the highest threshold voltage available for the process used to create the VCO.

12 Claims, 1 Drawing Sheet

(52) U.S. Cl.
CPC ......... *H03B 5/1215* (2013.01); *H03B 5/1228* (2013.01); *H03K 3/013* (2013.01); *H03B 2200/009* (2013.01)

(58) Field of Classification Search
CPC ...... H03B 2200/0088; H03B 2200/009; H03B 2202/02; H03B 2202/022; H03B 2202/025; H03K 3/013
USPC .................................................. 331/105, 115
See application file for complete search history.

(56) References Cited

U.S. PATENT DOCUMENTS

| | | | |
|---|---|---|---|
| 5,216,390 A * | 6/1993 | Erftemeijer | H03K 3/354 331/113 R |
| 6,211,745 B1 * | 4/2001 | Mucke | H01L 27/0805 257/312 |
| 6,426,680 B1 * | 7/2002 | Duncan | H01F 17/0006 257/E27.046 |
| 9,083,349 B1 * | 7/2015 | Townsend | H03L 5/00 |
| 2003/0137796 A1 * | 7/2003 | Bulucea | H01L 27/0808 361/277 |
| 2015/0028924 A1 * | 1/2015 | Chao | H03K 4/90 327/133 |

OTHER PUBLICATIONS

Pepe et al., Suppression of Flicker Noise Up-Conversion in a 65-nm CMOS VCO in the 3.0-to-3.6 GHz Band, IEEE Journal of Solid-State Circuits, Jul. 29, 2013, pp. 2375-2389, vol. 48, No. 10, IEEE, USA.

* cited by examiner

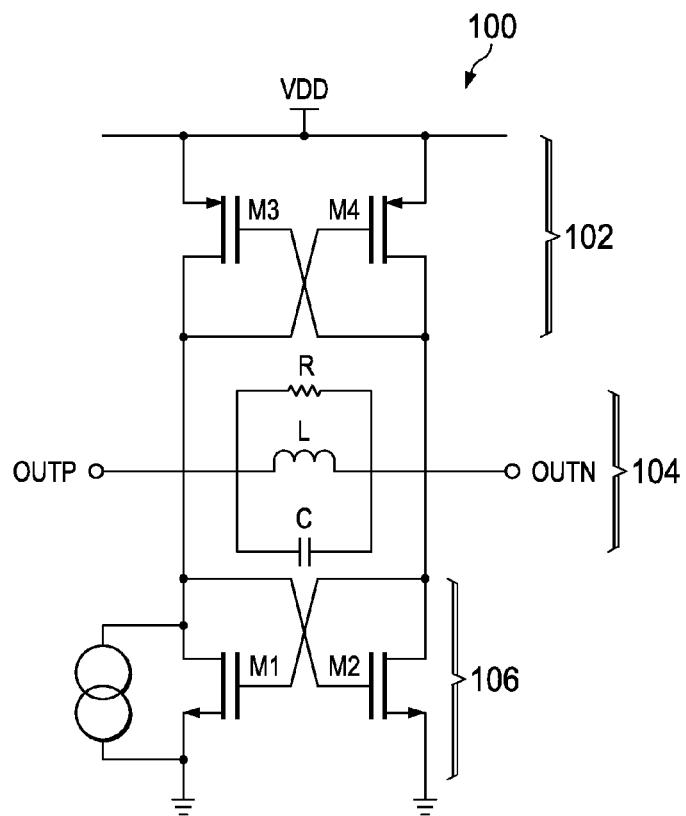
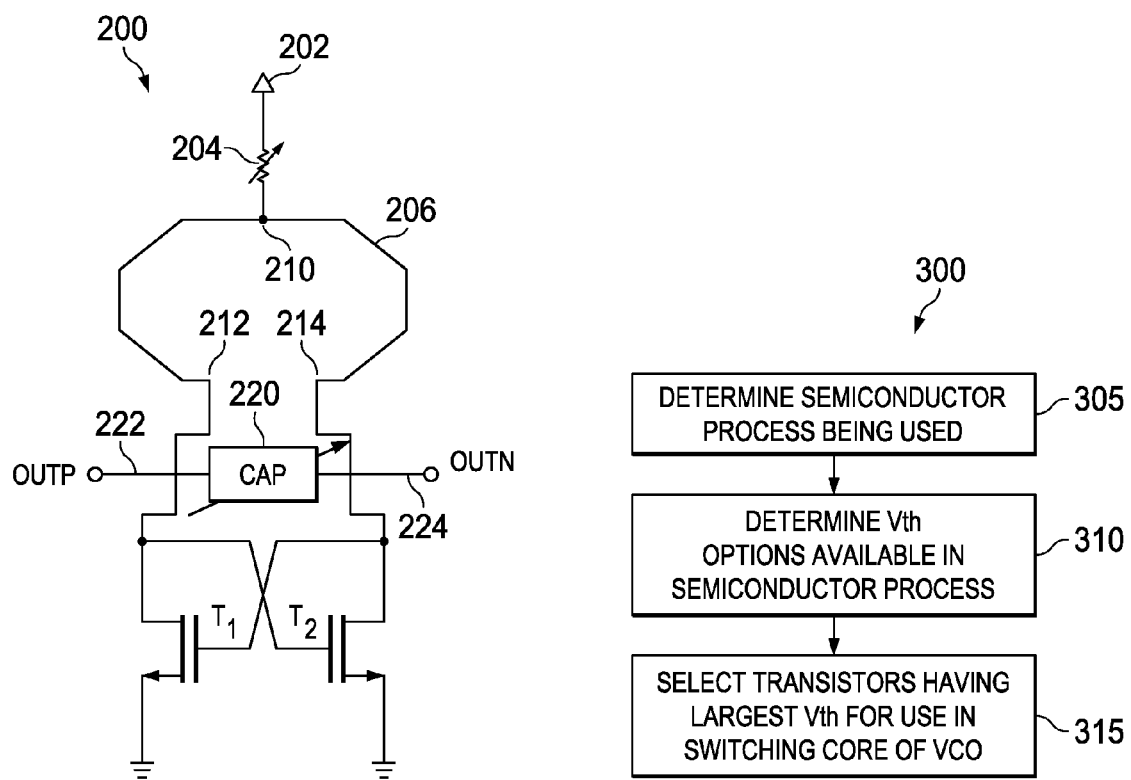
FIG. 1
FIG. 2
FIG. 3

METHOD AND APPARATUS HAVING ENHANCED OSCILLATOR PHASE NOISE USING HIGH VT MOS DEVICES

CLAIM OF PRIORITY AND RELATED PATENT APPLICATIONS

This nonprovisional application claims priority based upon the following prior United States provisional patent application(s): (i) "METHOD OF ENHANCED OSCILLATOR PHASE NOISE USING HIGH Vt MOS DEVICES," Application No. 61/993,490, filed May 15, 2014, in the name(s) of Himanshu Arora, Siraj Akhtar, and Nikolaus Klemmer; which is hereby incorporated by reference in its entirety.

FIELD OF THE DISCLOSURE

Disclosed embodiments relate generally to the field of voltage-controlled oscillators. More particularly, and not by way of any limitation, the present disclosure is directed to providing low noise in a voltage-controlled oscillator (VCO).

BACKGROUND

In transceivers, the VCO is an important circuit and oscillator phase noise is a significant source of performance degradation. Phase noise is the result of small random fluctuations or uncertainty in the phase of an electronic signal. Phase noise is specified and measured because it is a fundamental limitation in the performance of systems, limiting dynamic range. This limitation shows up in communications as loss of sensitivity. For VCOs used in frequency synthesizers that clock high-speed, high-bandwidth data converters, it is desirable to achieve a high degree of spectral purity in order to avoid degrading the signal-to-noise ratio (SNR).

SUMMARY

A switching core for an LC-VCO is disclosed having transistors with the highest threshold voltage (Vth) available for the selected semiconductor process. High Vth transistors are shown to provide lower noise when used for cross coupled switching core in an LC-VCO, despite the fact the high Vth transistors are noisier when tested alone.

The present patent application discloses methods and devices for providing a low-noise VCO.

In one aspect, an embodiment of a voltage-controlled oscillator (VCO) is disclosed. The VCO comprises a resonator circuit connected to receive an input voltage and having a first output node and a second output node; and at least one cross-coupled switching circuit portion, each cross-coupled switching circuit portion comprising a first transistor having a drain connected to the first output node and a second transistor having a drain connected to the second output node, the first transistor having a gate connected between the drain of the second transistor and the second output node and the second transistor having a gate connected between the drain of the first transistor and the first output node, each of the first and second transistors having a threshold voltage that is determined to be the highest threshold voltage available for the process used to create the VCO.

In another aspect, an embodiment of a method of designing a switching core for a voltage-controlled oscillator (VCO) is disclosed. The method comprises determining a semiconductor process being used for the VCO; determining voltage threshold options available for the semiconductor process; and selecting transistors having a largest voltage threshold that is available for use in the switching core of the VCO.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

FIG. 1 depicts an example of a VCO that can be used in an embodiment of the disclosure;

FIG. 2 depicts an example of a multi-port inductor-based VCO used to simulate phase noise in an embodiment of the disclosure;

FIG. 3 depicts a method of designing a low-noise VCO.

DETAILED DESCRIPTION OF THE DRAWINGS

Specific embodiments of the invention will now be described in detail with reference to the accompanying Figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Referring now to the drawings and more particularly to FIG. 1, an example is shown of a voltage-controlled oscillator (VCO) that can be used in an embodiment of the disclosure. VCO 100 receives a direct current (DC) input voltage VDD and provides an alternating current (AC) voltage on output nodes outp and outn. The embodiment illustrated in this example contains resonator circuit 104 (also known as an LC tank for the inductor (L) and capacitor (C) contained therein) and a switching core 102, 106. Resonator circuit 104 generates the output oscillations, while switching core 102, 106 provides the transconductance (gm) necessary to make up for losses in the VCO from both the resonator circuit 104 and transistors M1, M2, M3, M4 in the switching core. A brief explanation of transconductance is helpful in understanding the circuit. Conductance of an electrical circuit is the inverse of resistance and indicates how well a circuit conducts; this concept is not widely used in electrical calculations except in connection with Field Effect Transistors (FETs) used as amplifiers and with their related circuits. In FETs operating between their threshold voltage (Vth) and saturation voltage (Vsat), a change in output current is related to a change in input voltage by a ratio called the transconductance of the device. Transconductance is given the symbol gm and gives an indication of the gain of a device, i.e. how much it amplifies a signal. The formula for gm relates a change (Δ) in output current (Iout) to a change of input Voltage (Vin) as follows:

$$gm=\Delta Iout/\Delta Vin.$$

Resonator circuit 104 contains a parasitic resistor R, oscillator L and capacitor C. Each of resistor R, oscillator L and capacitor C has a first terminal connected in common to output node outp and a second terminal connected in common to output node outn. Switching core 106 is connected between the output nodes outp, outn and the lower voltage rail, e.g., ground. Transistor M1 has a drain connected to output node outp, a source connected to the lower voltage rail and a gate connected to a point between output node outn and the drain of transistor M2. Transistor M2 has a drain connected to output node outn, a source connected to the lower voltage rail, and a gate connected to a point between output node outp and the drain of transistor M1. Switching core 102 is connected between output nodes outp, outn and the upper voltage rail VDD. Transistor M3 has a drain connected to output node outp, a source connected to the upper voltage rail and a gate connected to a point between output node outn and the drain of transistor M4. Transistor M4 has a drain connected to output node outn, a source connected to VDD, and a gate connected to a point between output node outp and the drain of transistor M3.

In the configuration shown by the cross-coupled pairs of transistors in switching core 102, 106, transistors M1, M2, M3, M4 act as negative resistance devices. In the embodiment shown, the switching core comprises two sections 102, 106 of cross-coupled transistors to form a double cross-coupled voltage-biased VCO: switching core section 102 contains cross-coupled PMOS negative resistance devices M3 and M4, and switching core section 106 contains cross-coupled NMOS negative resistance devices M1 and M2. Although FIG. 1 discloses a double cross-coupled embodiment of a VCO containing both PMOS and NMOS transistors, one skilled in the art will recognize that VCO 100 can also have a switching core that comprises a single pair of cross-coupled transistors. In at least one embodiment, VCO 100 comprises switching core section 102, which contains PMOS negative resistance devices M3 and M4, and resonator circuit 104. In at least one embodiment, VCO 100 comprises resonator circuit 104 and switching core section 106, which contains NMOS negative resistance devices M1 and M2. Whether VCO contains one or two pairs of cross-coupled transistors in the switching core, each of M1, M2, M3, M4 is selected to have the highest available threshold voltage (Vth) for the process used, in contrast to the prior art which teaches that a low noise, low threshold voltage be selected. More on this selection follows.

In selecting NMOS devices to be used in an embodiment of switching core 106, Applicants first evaluated the noise produced by three NMOS devices that are available for the desired process, which in this instance was 45-nm CMOS. The three devices are a 2P5V transistor having a Vth of 1.2V, a 1P8V transistor having a Vth of 0.55V, and a 1P1V transistor having a Vth of 0.40V; each of these devices was used for intrinsic device noise simulation as a diode connected device. The NMOS devices were biased with the same Ibias of 4 mA and sized to give comparable transconductance. The results of this noise determination are shown in the following Table 1:

TABLE 1

| | 2P5V Device | 1P8V Device | 1P1V Device |
|---|---|---|---|
| Nominal Vth (V) | 1.2 | 0.55 | 0.40 |
| Noise V(√Hz) | | | |
| @ 100 KHz | 2.5E−7 | 1.8E−7 | 8.6E−8 |
| @ 1 MHz | 7.9E−8 | 5.0E−8 | 3.2E−8 |
| @ 10 MHz | 2.2E−8 | 1.6E−8 | 1.0E−8 |

As seen in this table, the 1P1V NMOS device provides the best noise performance as a stand-alone device. This is not a surprising result, as it is generally accepted that devices with a low Vth are not as noisy as devices with a high Vth. In particular, at 10 MHZ offset, the 1P1V NMOS device was 4 dB better than the 1 P8V device and 6.8 dB better than the 2P5V NMOS device.

Applicants next determined the phase noise of each of the three devices when implemented in the switching core of an LC VCO. A simulation was performed for a 3-port inductor based VCO at 10 GHz at various offsets, although one skilled in the art would recognize that other VCO configurations can also be used. FIG. 2 shows an example 3-port inductor based VCO 200 that can be used in an embodiment of the disclosure. In this embodiment, node 202 and variable resistor 204 provide an input voltage to inductor 206 at center port 210. Ports 212, 214 of inductor 206 and terminals 222, 224 respectively of capacitor circuit portion 220 are connected in common to differential output nodes outp, outn. The switching core is comprised of NMOS transistors T1 and T2; which are each connected between one terminal of capacitor circuit portion 220 and the lower rail. Transistor T1 has a drain connected to terminal 222 of capacitor circuit portion 220, a source connected to the lower rail, and a gate connected to a point between terminal 224 and the drain of transistor T2. Transistor T2 has a drain connected to terminal 224 of capacitor circuit portion 220, a source connected to the lower rail, and a gate connected to a point between terminal 222 and the drain of transistor T1.

For comparison fairness among the different NMOS devices, the same LC tank and ideal VDD were used in each simulation. Additionally, for each negative resistance device, the Ibias of the LC tank was adjusted to obtain the best VCO spot phase noise. The results are shown in Table 2:

TABLE 2

| | 2P5V Device | 1P8V Device | 1P1V Device |
|---|---|---|---|
| Nominal Vth (V) | 1.2 | 0.55 | 0.40 |
| Tox (Angstrom) | 55 | 31 | 20 |
| VDD (V) | 2.0 | 1.6 | 1.4 |
| Swing (sepp) (V) | 1.66 | 1.3 | 1.1 |
| % of Tvco with Vgd > Vth | 24% | 34% | 40% |
| Current (mA) | 6 | 5.1 | 4.1 |
| Power (mW) | 12 | 8.2 | 5.7 |
| Phase Noise (dBc/Hz) | | | |
| @ 100 KHz | −99.0 | −91.7 | −92.6 |
| @ 1 MHz | −119.3 | −116.8 | −115.3 |
| @ 10 MHz | −139.4 | −137.9 | −135.9 |
| @ 40 MHz | −151.4 | −150.0 | −148.0 |

The results in Table 2 demonstrate that although the 2P5V device was the noisiest device when operating alone, in the context of the switching core for an LC-VCO, the 2P5V device provided the quietest operation (best phase noise). Similarly, although the 1P1V device was the quietest device operating alone, the 1P1V device provided the noisiest operation (worst phase noise for the VCO.

Applicants note that the Vth of the switching core devices determines the time that these devices spend in the linear region, i.e., when these transistors are turned on but are not yet at saturation. When the switching core transistors are turned on, the current through these devices takes energy from the resonator circuit, also known as dequeing the tank, and degrades the phase noise. Accordingly, it is desirable that the switching core transistors spend less time in the linear region. Analysis of the VCO waveforms in the above disclosed simulations indicates that for the same VCO swing, a lower Vth transistor in the switching core goes deeper into linear mode. The lower Vth transistor is thus in linear mode for a longer duration of time, as shown by the values of % of Tvco with Vgd>Vth as shown in Table 2. As a result, in a given VCO period, the resonator of the low Vth embodiment is loaded by the lower Vth device for a longer duration of time. This results in a lower quality (Q) factor (a dimensionless parameter, a higher Q indicates a lower rate of energy loss relative to the stored energy of the resonator) of the LC tank and degrades the VCO phase noise. In other words, for a given VCO swing, using a higher Vth device for the negative resistance switching core lowers the harmonic distortion in the drain current of the switching core. This implies higher energy in the fundamental component of drain current in the LC tank and hence better phase noise.

In addition to improving the noise in the VCO, it is notable that the higher Vth transistors are generally implemented with a thicker gate oxide, as is demonstrated by Tox in Table 2. Due to this factor, the higher Vth devices are more robust to device performance degradation due to time dependent dielectric breakdown. Thus, the 2P5V device in this example, as well as higher Vth devices in general, provides both reliability and better phase noise performance in VCOs.

FIG. 3 describes an embodiment of a method 300 for designing a VCO switching core. The process begins with determining the semiconductor process or manufacturing node being used (305). In at least one embodiment, the process is 45-nm CMOS. In other embodiments, the process can be, for example, 32 nm, 22 nm, 14 nm, 10 nm, or even smaller. The disclosed design process is applicable to any process that uses metal on silicon field effect transistors (MOSFETs). The process continues with a determination of the Vth options available for transistors using the desired semiconductor process (310). In general for advanced CMOS technologies, basic options available to customers include at least two Vth options. In at least one embodiment, specialized versions of the baseline technologies are available in which additional Vth options are provided. In at least one embodiment, a MOSFET is designed to provide a higher Vth than normally available for use in the switching core of a VCO. Finally, from the available transistors, the device having the highest Vth is selected for use in the switching core of the VCO (315).

In contrast to the disclosed embodiments, a prior reference, "Suppression of Flicker Noise Up-Conversion in a 65-nm CMOS CVO in the 3.0-to-3.6 GHz Band," by Pepe et al., in IEEE J. Solid State Circuits, vol. 48, pp. 2375-2389, October 2013, has suggested adding a resistor to the drain of each transistor used in the switching core of a VCO as a means of providing better noise performance at low frequency offset (e.g., 10-100 KHz) without degrading the noise performance at high frequency offset. Applicants analyzed the phase noise in a VCO using this methodology. In the presence of the drain resistor, the negative gm impedance increases in magnitude. Thus, to get the same VCO swing the LC tank requires high bias current.

$$Vx/Ix = -2(1+R*gds)/(gm-gs)$$

The negative resistance devices are in linear region for Voutp−Voutn>Vth−Ibias*R. Increasing the Ibias results in lowering Vth−Ibias*R. In other words, increasing Ibias to increase the VCO swing causes the negative resistance devices to spend more time in linear region. This loads the tank and thus degrades the VCO phase noise. The simulation results of VCO phase noise with varying R and constant Ibias are presented in Table 3:

TABLE 3

| | R = 0 | R = 80 Ohm | R = 160 Ohm |
|---|---|---|---|
| Swing (diff peak-to-peak)(V) | 1.66 | 1.15 | 0.7 |
| Phase Noise (dBc/Hz) | | | |
| @ 1 MHz | −116.2 | −115.0 | −110.0 |
| @ 10 MHz | −137.0 | −135.0 | −131.0 |

Applicants note that these results show a much higher degradation in phase noise with increasing R than was reported in the reference, especially at high frequency offset.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A voltage-controlled oscillator (VCO), comprising:
   a resonator circuit connected to receive an input voltage and having a first output node and a second output node; and
   at least one cross-coupled switching circuit portion, each cross-coupled switching circuit portion comprising a first transistor having a drain connected to the first output node and a second transistor having a drain connected to the second output node, the first transistor having a gate connected between the drain of the second transistor and the second output node and the second transistor having a gate connected between the drain of the first transistor and the first output node, each of the first and second transistors having a threshold voltage that is determined to be the highest threshold voltage available for the process used to create the VCO, wherein a magnitude of the threshold voltage for each of the first and second transistors is greater than or equal to one volt.

2. The VCO as recited in claim 1, wherein the resonator circuit comprises at least one inductor circuit and at least one capacitor circuit, a first terminal of the at least one inductor circuit and a first terminal of the at least one capacitor circuit being connected in common to the first output node and a second terminal of the at least one inductor circuit and a second terminal of the at least one capacitor circuit being connected in common to the second output node.

3. The VCO as recited in claim 2, wherein the resonator circuit comprises a multiport inductor.

4. The VCO as recited in claim 1, wherein the first and second transistors are, respectively, first and second NMOS transistors, each of said first and second NMOS transistors having a source connected to a lower voltage rail.

5. The VCO as recited in claim 1, wherein the first and second transistors are, respectively, first and second PMOS transistors, each of said first and second PMOS transistors having a source connected to an upper voltage rail.

6. The VCO as recited in claim 1, wherein the at least one cross-coupled switching circuit portion comprises a first cross-coupled switching circuit portion comprising first and second PMOS transistors, each of said first and second PMOS transistors having a source connected to an upper voltage rail, and a second cross-coupled switching circuit portion comprising first and second NMOS transistors, each of said first and second NMOS transistors having a source connected to an lower voltage rail.

7. A voltage-controlled oscillator (VCO), comprising:
a resonator circuit connected to receive an input voltage and having a first output node and a second output node; and
at least one cross-coupled switching circuit portion, each cross-coupled switching circuit portion comprising a first transistor having a drain connected to the first output node and a second transistor having a drain connected to the second output node, the first transistor having a gate connected between the drain of the second transistor and the second output node and the second transistor having a gate connected between the drain of the first transistor and the first output node, each of the first and second transistors having a threshold voltage that is determined to be the highest threshold voltage available for the process used to create the VCO.

8. The VCO as recited in claim 7, wherein the resonator circuit comprises at least one inductor circuit and at least one capacitor circuit, a first terminal of the at least one inductor circuit and a first terminal of the at least one capacitor circuit being connected in common to the first output node and a second terminal of the at least one inductor circuit and a second terminal of the at least one capacitor circuit being connected in common to the second output node.

9. The VCO as recited in claim 8, wherein the resonator circuit comprises a multiport inductor.

10. The VCO as recited in claim 7, wherein the first and second transistors are, respectively, first and second NMOS transistors, each of said first and second NMOS transistors having a source connected to a lower voltage rail.

11. The VCO as recited in claim 7, wherein the first and second transistors are, respectively, first and second PMOS transistors, each of said first and second PMOS transistors having a source connected to an upper voltage rail.

12. The VCO as recited in claim 7, wherein the at least one cross-coupled switching circuit portion comprises a first cross-coupled switching circuit portion comprising first and second PMOS transistors, each of said first and second PMOS transistors having a source connected to an upper voltage rail, and a second cross-coupled switching circuit portion comprising first and second NMOS transistors, each of said first and second NMOS transistors having a source connected to an lower voltage rail.

* * * * *